(12) United States Patent
Ochi et al.

(10) Patent No.: US 11,751,445 B2
(45) Date of Patent: Sep. 5, 2023

(54) DISPLAY DEVICE

(71) Applicant: SHARP KABUSHIKI KAISHA, Sakai (JP)

(72) Inventors: Hisao Ochi, Sakai (JP); Jumpei Takahashi, Sakai (JP); Tohru Sonoda, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 186 days.

(21) Appl. No.: 17/040,899

(22) PCT Filed: Mar. 29, 2018

(86) PCT No.: PCT/JP2018/013482
§ 371 (c)(1),
(2) Date: Sep. 23, 2020

(87) PCT Pub. No.: WO2019/186979
PCT Pub. Date: Oct. 3, 2019

(65) Prior Publication Data
US 2021/0013296 A1 Jan. 14, 2021

(51) Int. Cl.
*H10K 59/131* (2023.01)
*H10K 50/844* (2023.01)
(Continued)

(52) U.S. Cl.
CPC ......... *H10K 59/131* (2023.02); *H10K 50/844* (2023.02); *H10K 50/8426* (2023.02); *H10K 59/124* (2023.02)

(58) Field of Classification Search
CPC ............. H01L 27/3276; H01L 27/3258; H01L 27/3246; H01L 51/5253; H01L 51/5246;
(Continued)

(56) References Cited

U.S. PATENT DOCUMENTS

2010/0072482 A1 3/2010 Eom et al.
2014/0203260 A1* 7/2014 Ookawara ........... H01L 51/5237
257/40
(Continued)

FOREIGN PATENT DOCUMENTS

JP 2012-089436 A 5/2012

*Primary Examiner* — Vongsavanh Sengdara
(74) *Attorney, Agent, or Firm* — ScienBiziP, P.C.

(57) ABSTRACT

A display device includes: a first conductive layer on a resin substrate layer; a planarization film on the first conductive layer; and OLEDs on the planarization film. There is provided a second conductive layer in a frame area surrounding a display area. The second conductive layer is in contact with second electrodes of the OLEDs on the planarization film and also in contact with the first conductive layer in an external side of the planarization film. The second electrode is electrically connected to the first conductive layer via the second conductive layer. The planarization film includes, in the frame area, a portion where there is provided a trench. The first conductive layer is exposed from the planarization film in the trench. The second electrode is electrically connected to the first conductive layer via the second conductive layer in the trench.

11 Claims, 14 Drawing Sheets

(51) Int. Cl.
*H10K 50/842* (2023.01)
*H10K 59/124* (2023.01)

(58) Field of Classification Search
CPC ........ H05B 33/04; H05B 33/22; H05B 33/06;
H05B 33/02; G09F 9/30; H10K 50/844;
H10K 50/8426; H10K 59/131; H10K 59/124
See application file for complete search history.

(56) References Cited

U.S. PATENT DOCUMENTS

| | | | |
|---|---|---|---|
| 2016/0285038 A1* | 9/2016 | Kim | H10K 50/8445 |
| 2016/0365398 A1* | 12/2016 | Kim | H10K 50/8426 |
| 2017/0033312 A1* | 2/2017 | Kim | H10K 59/131 |
| 2017/0262109 A1* | 9/2017 | Choi | H01L 27/3258 |
| 2017/0288008 A1* | 10/2017 | Kim | G09G 3/3258 |
| 2017/0365814 A1* | 12/2017 | Kim | H10K 50/8445 |
| 2017/0373128 A1* | 12/2017 | Lee | H10K 59/131 |
| 2018/0013092 A1* | 1/2018 | Park | H10K 50/8426 |
| 2018/0033998 A1* | 2/2018 | Kim | H10K 59/124 |
| 2018/0166525 A1* | 6/2018 | Kim | H10K 59/131 |
| 2018/0366529 A1* | 12/2018 | Lee | H10K 71/70 |

* cited by examiner

DISPLAY DEVICE

TECHNICAL FIELD

The technology disclosed here relates to display devices.

BACKGROUND ART

The OLED display device, or the self-luminous display device built around OLEDs (organic light-emitting diodes), has been attracting attention as an alternative to the liquid crystal display device. The OLED display device has a display area for displaying an image using the light emitted by OLEDs and a frame area surrounding the display area. There is a demand for OLED display devices with a narrow frame for a better appearance and reduced dimensions.

An OLED includes, for example, a first electrode as an anode, a second electrode as a cathode, and an organic light-emitting layer between the first and second electrodes. The frame area includes a terminal portion for connecting to, for example, external circuitry and a power supply. There is also provided a plurality of frame lines in the frame area between the display area and the terminal portion. The second electrodes are electrically connected to terminals of the terminal portion via the frame lines (see, for example, Patent Literature 1).

CITATION LIST

Patent Literature

Patent Literature 1: Japanese Unexamined Patent Application Publication, Tokukai, No. 2012-89436

SUMMARY

Technical Problem

To electrically connect the second electrode to a first conductive layer in the frame line, the OLED display device has, for example, a structure where: a second conductive layer is used that is formed of the same material in the same layer as the first electrode; the second electrode is in contact with the second conductive layer; and the second conductive layer is in contact with the first conductive layer. There is a need, however, to reduce the widths of the first conductive layer and the second conductive layer to meet the demand for a narrow frame. It is hence difficult to ensure a sufficient contact area between the second electrode and the second conductive layer and also between the first conductive layer and the second conductive layer. If electrical resistance increases between the second electrode and the first conductive layer (routing lines) due to an insufficient contact area, the OLED display device becomes incapable of producing stable image displays and may exhibit unsatisfactory display quality.

The technology disclosed here has been made in view of these problems. It is an object of the technology to reduce electrical resistance between a first conductive layer and an electrode of a light-emitting element such as an OLED to ensure the display quality of a display device.

Solution to Problem

The technology disclosed here is directed to a display device including: a substrate; a first conductive layer on the substrate; a planarization film on the first conductive layer; and a light-emitting element on the planarization film. The display device has: a display area where an image is displayed using light emitted by the light-emitting element; and a frame area surrounding the display area. The frame area includes a second conductive layer in contact with an electrode of the light-emitting element on the planarization film and also in contact with the first conductive layer in an external side of the planarization film. The electrode of the light-emitting element is electrically connected to the first conductive layer via the second conductive layer. The planarization film includes, in the frame area, a portion where a trench extends through the planarization film in such a manner that the trench divides the planarization film into a segment internal to the frame area and a segment external to the frame area. The first conductive layer is provided additionally in a location corresponding to the trench. The additional first conductive layer is exposed from the planarization film in the trench. The electrode of the light-emitting element is in contact with the second conductive layer in the trench and electrically connected to the first conductive layer via the second conductive layer.

Advantageous Effects of Disclosure

In the display device described above, the trench is formed in the planarization film in the frame area, and the electrode of the light-emitting element is electrically connected to the first conductive layer in the external side of the planarization film and electrically connected via the second conductive layer to the first conductive layer exposed from the planarization film in the trench. It therefore becomes possible to ensure contact area between the electrode of the light-emitting element and the second conductive layer and between the first conductive layer and the second conductive layer, which reduces electrical resistance between the electrode of the light-emitting element and the first conductive layer. This in turn ensures the display quality of the display device.

DESCRIPTION OF EMBODIMENTS

The following will describe an illustrative embodiment in detail with reference to drawings.

This embodiment will describe a display device in accordance with the technology disclosed here by taking an OLED display device as an example.

Figure 1:
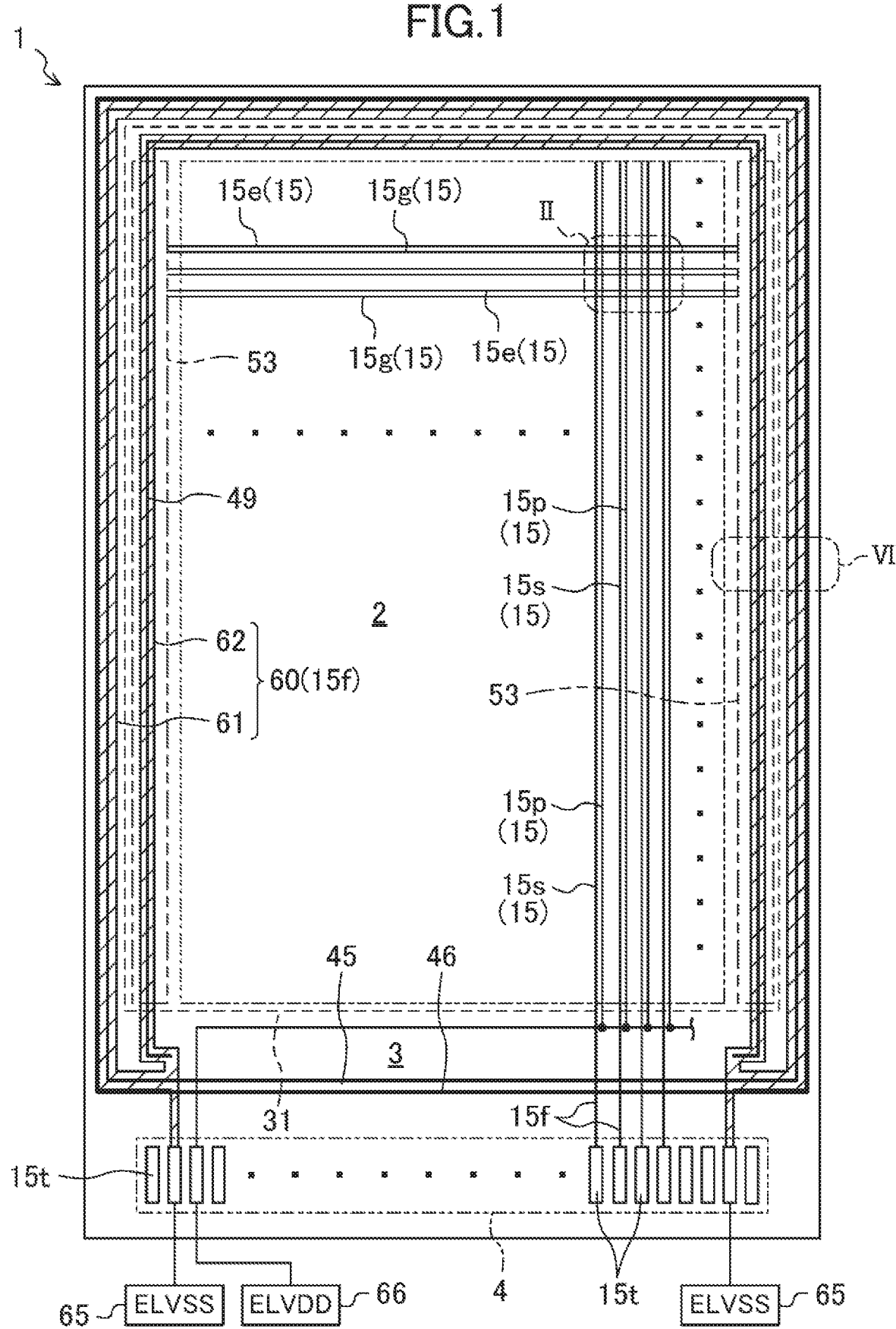
FIG. 1 is a schematic plan view of a structure of an OLED display device in accordance with an embodiment.
Figure 2:
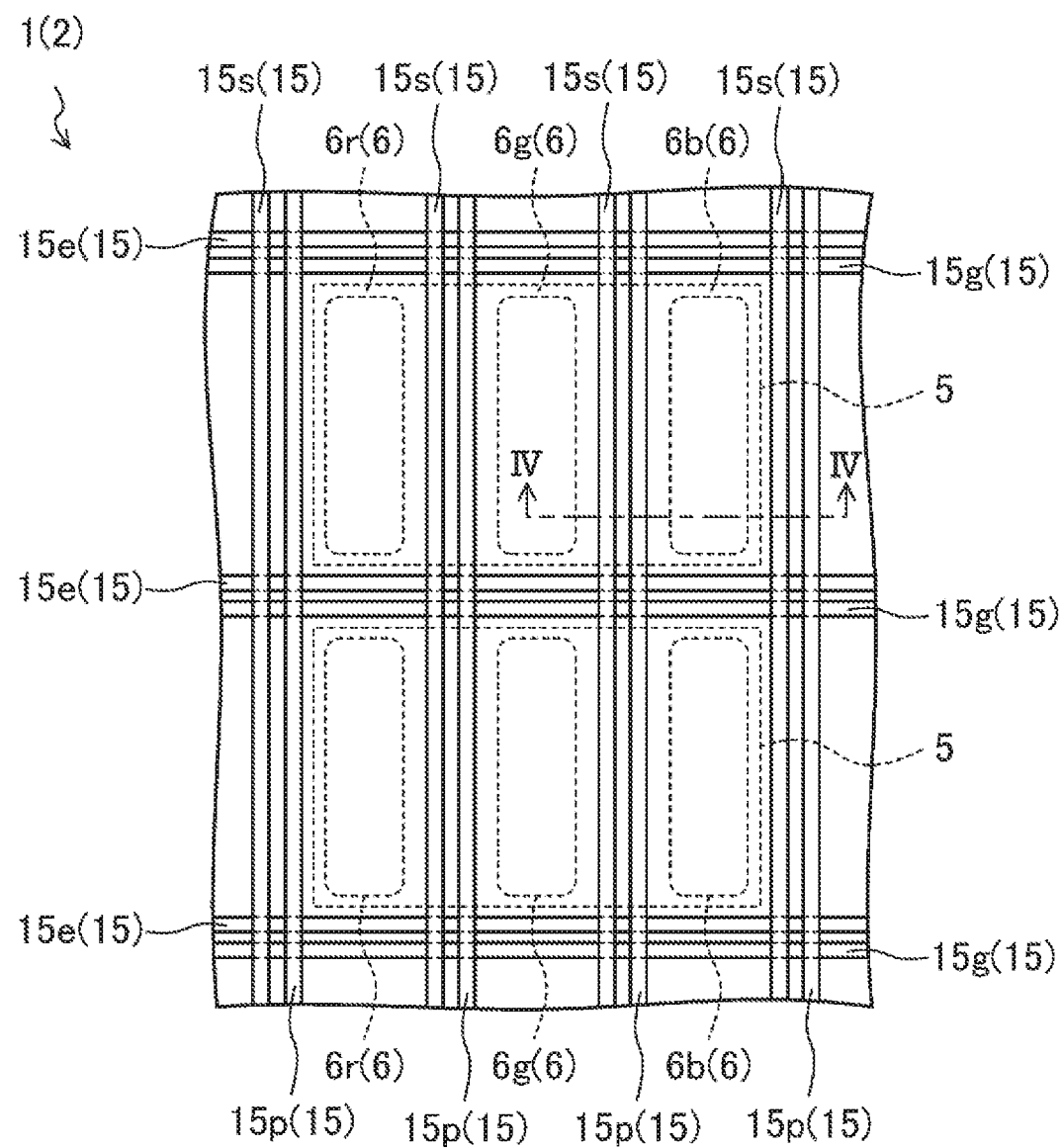
FIG. 2 is a plan view of a part, denoted by II, of a display area of the OLED display device shown in FIG. 1.
Figure 3:
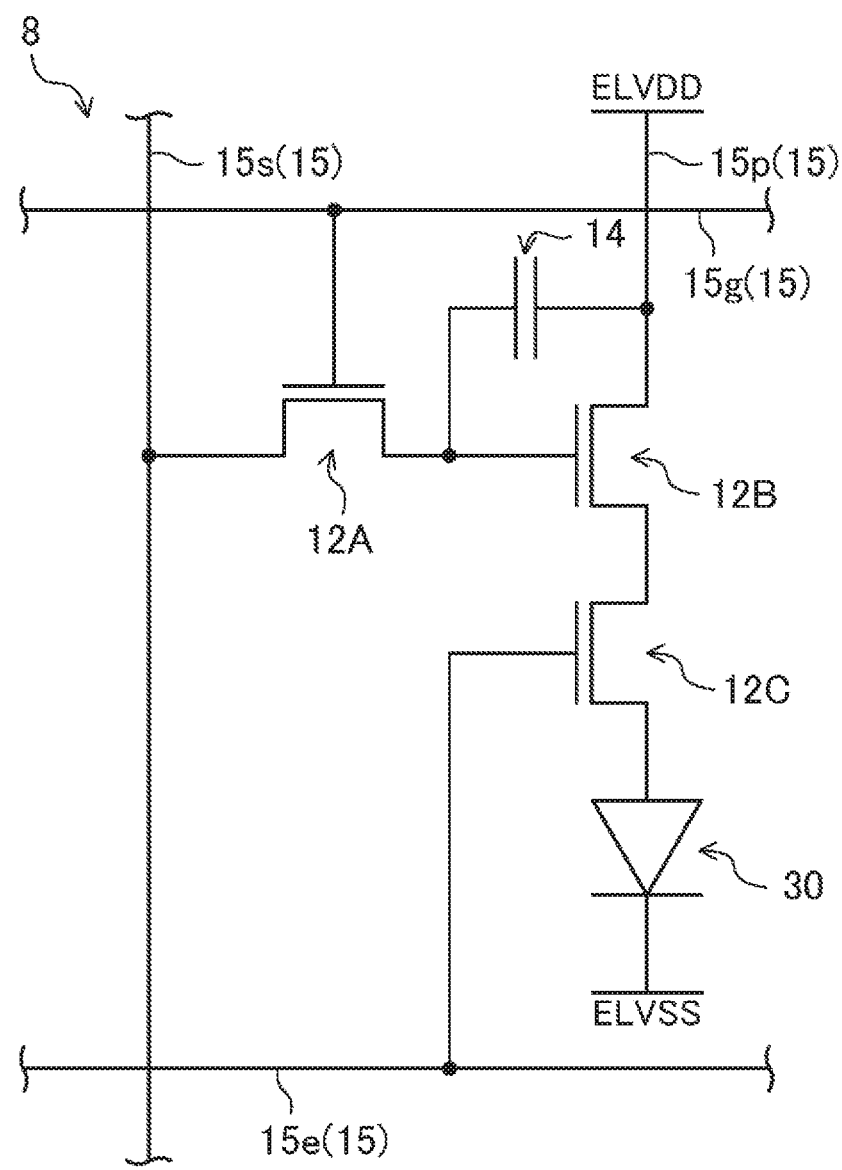
FIG. 3 is an equivalent circuit diagram of a part of a TFT layer in the OLED display device in accordance with the embodiment.
Figure 4:
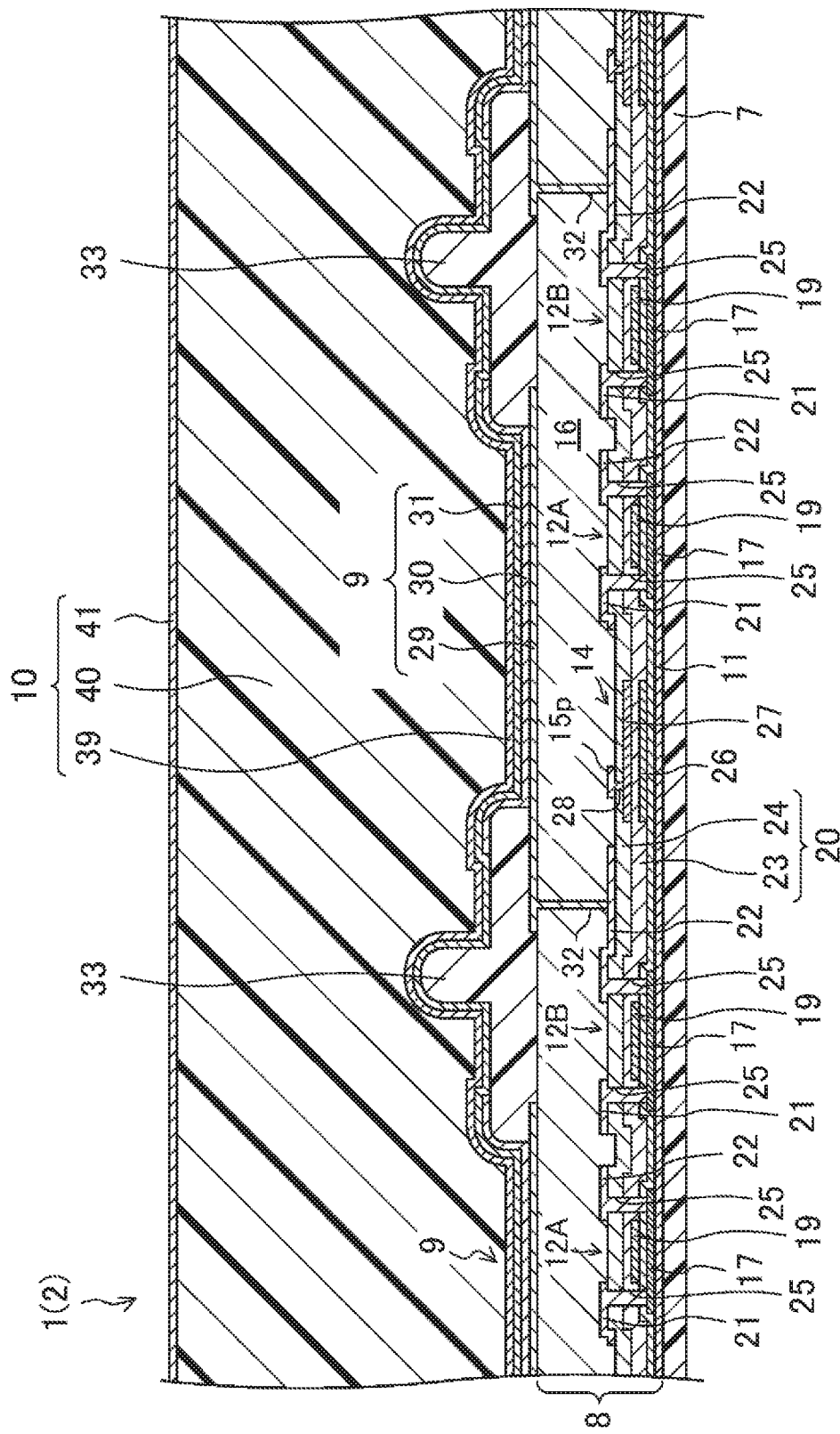
FIG. 4 is a cross-sectional view, taken along line IV-IV, of the display area shown in FIG. 2.
Figure 5:
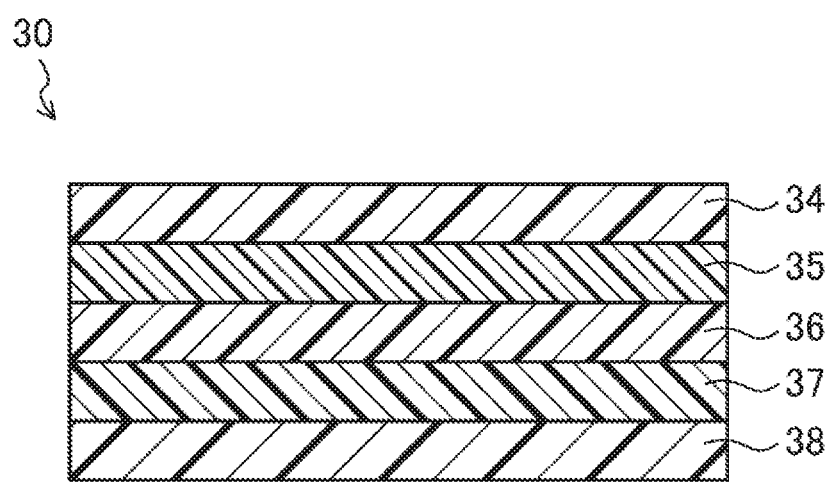
FIG. 5 is a cross-sectional view of a structure of an organic light-emitting layer in the OLED display device.

FIG. 1 is a schematic plan view of a structure of an OLED display device 1. FIG. 2 is a plan view of a part, denoted by II, of a display area 2 of the OLED display device 1 shown in FIG. 1. FIG. 3 is an equivalent circuit diagram of a part of a TFT layer 8 in the OLED display device 1. FIG. 4 is a cross-sectional view, taken along line IV-IV, of the display area 2 shown in FIG. 2. FIG. 5 is a cross-sectional view of a structure of an organic light-emitting layer 30 in the OLED display device 1.

Referring to FIG. 1, the OLED display device 1 has the rectangular display area 2 for displaying an image and a frame area 3 shaped like a rectangular frame and surrounding the display area 2. There is provided a terminal portion 4 for connecting to, for example, external circuitry and a power supply on a portion that constitutes a side of the frame area 3. The terminal portion 4 is connected to an end of a wiring substrate (not shown) such as FPC (flexible printed circuit).

The portions that constitute the sides of the frame area 3 adjacent to the side thereof on which the terminal portion 4 is provided (the left and right sides of the frame area 3 in FIG. 1) include control circuit regions 53 each including a gate driver circuit (control circuit) 51 and a light-emission control circuit 52 (see FIG. 6) respectively. The gate driver circuit 51 and the light-emission control circuit 52 are monolithically formed on a substrate. A plurality of frame lines 15f is provided in the frame area 3 between the display area 2 and the terminal portion 4. Each frame line 15f provides a wiring terminal 15t that is electrically connected to the wiring substrate via the terminal portion 4. These wiring terminals 15t are arranged in a prescribed pattern in the terminal portion 4.

Some of the frame lines 15f are low-voltage power supply lines 60 (hatched with oblique lines in FIG. 1). Each low-voltage power supply line 60 includes an outer line 61 disposed around the display area 2 and an inner line 62 provided between the outer line 61 and the display area 2. These outer and inner lines 61 and 62 are separated by those portions that constitute the three sides of the frame area 3 other than the side thereof on which the terminal portion 4 is provided.

The outer line 61 is disposed outwards in the frame area 3. The inner line 62 is separated by a distance from the outer line 61 and extends along the outer line 61. The outer and inner lines 61 and 62 are connected integrally to each other on the side on which the terminal portion 4 is provided and are pulled out until reaching the terminal portion 4. The low-voltage power supply line 60 is electrically connected to a low-voltage power supply (ELVSS) 65 via one of the wiring terminals 15t on the terminal portion 4.

The OLED display device 1 operates by active matrix addressing. There is provided a matrix of pixels 5 shown in FIG. 2 in the display area 2. Each pixel 5 includes, for example, three-color subpixels 6 composed of a subpixel 6r for producing a red display, a subpixel 6g for producing a green display, and a subpixel 6b for producing a blue display. The three-color subpixels 6r, 6g, and 6b are formed, for example, like parallel stripes.

Referring to FIG. 4, the OLED display device 1 includes: a resin substrate layer 7 as a substrate; the TFT (thin film transistor) layer 8 in the resin substrate layer 7; OLEDs 9 as light-emitting elements on the TFT layer 8; and a sealing film 10 covering the OLEDs 9.

The resin substrate layer 7 is made of, for example, a polyimide resin to be flexible.

The TFT layer 8 includes: a base coat film 11 on the resin substrate layer 7; a plurality of first TFTs 12A, a plurality of second TFTs 12B, a plurality of a third TFTs 12C, a plurality of capacitors 14, and various display-use lines 15 on the base coat film 11; and a planarization film 16 covering these first TFTs 12A, second TFTs 12B, third TFTs 12C, capacitors 14, and display-use lines 15.

The base coat film 11 includes a single inorganic insulating film of, for example, silicon nitride, silicon oxide, or silicon oxynitride or a stack of any of these inorganic insulating films. The first TFTs 12A, the second TFTs 12B, the third TFTs 12C, and the capacitors 14 are provided one each for every subpixel 6.

Referring to FIGS. 2 and 3, the display-use lines 15 include: a plurality of gate lines 15g for transmitting gate signals; a plurality of light-emission control lines 1e for transmitting light-emission control signals; a plurality of source lines 15s for transmitting source signals; and a plurality of high-voltage power supply lines 15p for supplying electric current to the OLEDs 9. The gate lines 15g extend parallel to each other. The light-emission control lines 15e extend parallel to each other along the gate lines 15g. The source lines 15s extend parallel to each other in a direction crossing the gate lines 15g and the light-emission control lines 15e. The high-voltage power supply lines 15p extend parallel to each other along the source lines 15s. These gate lines 15g, light-emission control lines 15e, source lines 15s, and high-voltage power supply lines 15p are insulated from each other and form a lattice of lines as a whole to divide the subpixels 6.

Each source line 15s and high-voltage power supply line 15p are pulled out as the frame lines 15f from the display area 2 to the terminal portion 4. The high-voltage power supply line 15p is electrically connected to a high-voltage power supply (ELVDD) 66 via terminals on the terminal portion 4. The gate lines 15g are connected to, and sequentially addressed by, the gate driver circuit 51 in the control circuit region 53. The light-emission control lines 1e are connected to, and sequentially addressed by, the light-emission control circuit 52 in the control circuit region 53. A plurality of control lines such as clock signal lines (not shown) is connected to the gate driver circuit 51 and the light-emission control circuit 52 and pulled out as the frame lines 15f to the terminal portion 4.

The first TFTs 12A, the second TFTs 12B, and the third TFTs 12C are examples of active elements and have, for example, a top-gate structure. Specifically, referred to FIG. 4, each first TFT 12A and each third TFT 12C include: an insular semiconductor layer 17 on the base coat film 11; a gate insulating film 18 covering the semiconductor layer 17; a gate electrode 19 overlapping a part (channel region) of the semiconductor layer 17 with the gate insulating film 18 intervening therebetween; an interlayer insulating film 20 covering the gate electrode 19; and a source electrode 21 and a drain electrode 22 on the interlayer insulating film 20. The second TFT 12B, not shown in FIG. 4, has the same structure as the first TFT 12A and the third TFT 12C.

The gate electrodes 19 are formed of the same material and in the same layer as the gate lines 15g. The interlayer insulating film 20 includes a stack of a first interlayer insulating film 23 and a second interlayer insulating film 24. The first interlayer insulating film 23, the second interlayer insulating film 24, and the gate insulating film 18 are a single inorganic insulating film of, for example, silicon nitride, silicon oxide, or silicon oxynitride or a stack of any of these inorganic insulating films.

The source electrode 21 and the drain electrode 22 are separated from each other and connected to different parts (a source region and a drain region) of the semiconductor layer 17 via contact holes 25 in the gate insulating film 18 and the interlayer insulating film 20. The source electrode 21 is formed of the same material and in the same layer as the source line 15s in the display area 2.

In the first TFT 12A, the gate electrode 19 is provided integrally to an associated one of the gate lines 15g, and the source electrode 21 is provided integrally to an associated one of the source lines 15s. The drain electrode 22 is electrically connected to the gate electrode 19 and the capacitor 14 of the second TFT. In the second TFT 12B, the source electrode 21 is electrically connected to the high-voltage power supply line 15p, and the drain electrode 22 is electrically connected to the source electrode 21 of the third TFT 12C. The gate electrode 19 of the third TFT 12C is electrically connected to the light-emission control line 15e.

The capacitor 14 is connected to an associated one of the first TFTs 12A and an associated one of the high-voltage power supply lines 15p. The capacitor 14 includes: a lower conductive layer 26 on the gate insulating film 18; the first interlayer insulating film 23 covering the lower conductive layer 26; and an upper conductive layer 27 overlapping the lower conductive layer 26 with the first interlayer insulating film 23 intervening therebetween. The lower conductive layer 26 is formed of the same material and in the same layer as the gate electrode 19. The upper conductive layer 27 is connected to the high-voltage power supply line 15p via a contact hole 28 in the second interlayer insulating film 24.

The planarization film 16 covers the third TFT 12C except for a part of the drain electrode 22 thereof in the display area 2 so that the surface of the TFT layer 8 is planarized and hence does not reflect the shape of the surface of the source line 15s, the high-voltage power supply line 15p, the first TFT 12A, the second TFT 12B, and the third TFT 12C. The planarization film 16 is made of, for example, a colorless, transparent organic resin material such as acrylic resin.

The OLEDs 9 are provided on the planarization film 16. The display area 2 includes these OLEDs 9. The OLEDs 9 have a top emission structure. Specifically, the OLEDs 9 include: a plurality of first electrodes 29 on the planarization film 16; the organic light-emitting layer 30 as a functional layer on the first electrodes 29; and a second electrode 31 overlapping the respective first electrodes 29 with the organic light-emitting layer 30 intervening therebetween.

The first electrodes 29, one for each subpixel 6, are arranged in a matrix. Each first electrode 29 is connected to the drain electrode 22 of the third TFT 12C in the associated one of the subpixels 6 via a contact hole 32 in the planarization film 16. The first electrode 29 has a function of injecting holes to the organic light-emitting layer 30. The first electrode 29 is preferably formed of a material that has a large work function in order to improve the efficiency of hole injection to the organic light-emitting layer 30.

The first electrode 29 is made of, for example, a metal material such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), or lithium fluoride (LiF).

Alternatively, the first electrode 29 may be made of, for example, an alloy such as a magnesium-copper (Mg—Cu) alloy, a magnesium-silver (Mg—Ag) alloy, a sodium-potassium (Na—K) alloy, an astatine-astatine oxide (At—AtO$_2$) alloy, a lithium-aluminum (Li—Al) alloy, a lithium-calcium-aluminum (Li—Ca—Al) alloy, or a lithium fluoride-calcium-aluminum (LiF—Ca—Al) alloy.

As another alternative, the first electrode 29 may be made of, for example, an electrically conductive oxide such as tin oxide (SnO), zinc oxide (ZnO), indium tin oxide (ITO), or indium zinc oxide (IZO). As a further alternative, the first electrode 29 may be a stack of layers of any of these materials. Examples of materials that have a large work function include indium tin oxide (ITO) and indium zinc oxide (IZO).

The first electrodes 29 of the adjacent subpixels 6 are divided from each other by an edge cover 33. The edge cover 33 is arranged to form a lattice covering the peripheral portions of the first electrodes 29. The edge cover 33 is made of, for example, an inorganic compound such as silicon oxide, silicon nitride, or silicon oxynitride or an organic resin material such as polyimide resin, acrylic resin, polysiloxane resin, or novolac resin.

The organic light-emitting layer 30 is provided to each subpixel 6. The organic light-emitting layer 30 includes a hole injection layer 34, a hole transport layer 35, a light-emitting layer 36, an electron transport layer 37, and an electron injection layer 38 that are provided in this sequence on the first electrodes 29 as shown in FIG. 5.

The hole injection layer 34, alternatively referred to as the anode buffer layer, has a function of bringing the energy levels of the first electrode 29 and the organic light-emitting layer 30 closer to each other to improve the efficiency of hole injection from the first electrode 29 to the organic light-emitting layer 30. The hole injection layer 34 is made of, for example, a triazole derivative, an oxadiazole derivative, an imidazole derivative, a polyaryl alkane derivative, a pyrazoline derivative, a phenylenediamine derivative, an oxazole derivative, a styrylanthracene derivative, a fluorenone derivative, a hydrazone derivative, or a stilbene derivative.

The hole transport layer 35 has a function of improving the efficiency of hole transport from the first electrode 29 to the organic light-emitting layer 30. The hole transport layer 35 is made of, for example, a porphyrin derivative, an aromatic tertiary amine compound, a styrylamine derivative, polyvinyl carbazole, poly-p-phenylene vinylene, polysilane, a triazole derivative, an oxadiazole derivative, an imidazole derivative, a polyaryl alkane derivative, a pyrazoline derivative, a pyrazolone derivative, a phenylenediamine derivative, an arylamine derivative, an amine-substituted chalcone derivative, an oxazole derivative, a styrylanthracene derivative, a fluorenone derivative, a hydrazone derivative, a stilbene derivative, hydroxylated amorphous silicon, hydroxylated amorphous silicon carbide, zinc sulfide, or zinc selenide.

The light-emitting layer 36 is injected with holes and electrons from the first electrodes 29 and the second electrodes 31 respectively when the light-emitting layer 36 is under the voltage applied by the first electrode 29 and the second electrode 31. These injected holes and electrons recombine in the light-emitting layer 36, to emit light. The light-emitting layer 36 in each subpixel 6 is made of a different material, depending on the color (e.g., red, green, or blue) of the light emitted by the OLED 9.

The light-emitting layer 36 is made of, for example, a metal oxynoid compound (8-hydroxy quinoline metal complex), a naphthalene derivative, an anthracene derivative, a diphenyl ethylene derivative, a vinyl acetone derivative, a triphenylamine derivative, a butadiene derivative, a coumarin derivative, a benzoxazole derivative, an oxadiazole derivative, a benzthiazole derivative, a styryl derivative, a styrylamine derivative, a bis(styryl)benzene derivative, a tris(styryl)benzene derivative, a perylene derivative, a perynone derivative, an aminopyrene derivative, a pyridine derivative, a rhodamine derivative, an acridine derivative, phenoxazone, a quinacridone derivative, rubrene, poly-p-phenylene vinylene, or polysilane.

The electron transport layer 37 has a function of efficiently transporting electrons to the light-emitting layer 36. The electron transport layer 37 is made of, for example, an organic compound such as an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, or a metal oxynoid compound.

The electron injection layer 38, alternatively referred to as the cathode buffer layer, has a function of bringing the energy levels of the second electrode 31 and the organic light-emitting layer 30 closer to each other to improve the efficiency of electron injection from the second electrode 31 to the organic light-emitting layer 30. The electron injection layer 38 is made of, for example, an inorganic alkali compound such as lithium fluoride (LiF), magnesium fluoride ($MgF_2$), calcium fluoride ($CaF_2$), strontium fluoride ($SrF_2$), or barium fluoride ($BaF_2$); aluminum oxide ($Al_2O_3$); or strontium oxide (SrO).

The second electrode 31 is provided commonly to the first electrodes 29 (i.e., commonly to the subpixels 6) to cover the organic light-emitting layer 30 as shown in FIG. 4. The second electrode 31 is electrically connected to the low-voltage power supply line 60 for connection to the low-voltage power supply (ELVSS) 65 on the wiring terminal 15t of the terminal portion 4 via the low-voltage power supply line 60. The second electrode 31 has a function of injecting electrons to the organic light-emitting layer 30. The second electrode 31 is preferably formed of a material that has a small work function in order to improve the efficiency of electron injection to the organic light-emitting layer 30.

The second electrode 31 is made of, for example, silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), or lithium fluoride (LiF).

Alternatively, the second electrode 31 may be made of, for example, a magnesium-copper (Mg—Cu) alloy, a magnesium-silver (Mg—Ag) alloy, a sodium-potassium (Na—K) alloy, an astatine-astatine oxide (At—$AtO_2$) alloy, a lithium-aluminum (Li—Al) alloy, a lithium-calcium-aluminum (Li—Ca—Al) alloy, or a lithium fluoride-calcium-aluminum (LiF—Ca—Al) alloy.

As another alternative, the second electrode 31 may be made of, for example, an electrically conductive oxide such as tin oxide (SnO), zinc oxide (ZnO), indium tin oxide (ITO), or indium zinc oxide (IZO). As a further alternative, the second electrode 31 may be a stack of layers of any of these materials. Examples of materials that have a small work function include magnesium (Mg), lithium (Li), lithium fluoride (LiF), a magnesium-copper (Mg—Cu) alloy, a magnesium-silver (Mg—Ag) alloy, a sodium-copper (Na—Cu) alloy, a magnesium-silver (Mg—Ag) alloy, a sodium-potassium (Na—K) alloy, a lithium-aluminum (Li—Al) alloy, a lithium-calcium-aluminum (Li—Ca—Al) alloy, and a lithium fluoride-calcium-aluminum (LiF—Ca—Al) alloy.

The sealing film 10 has a function of protecting the OLEDs 9 from, for example, water and oxygen. The sealing film 10 includes: a first inorganic layer 39 covering the second electrodes 31; an organic layer 40 on the first inorganic layer 39; and a second inorganic layer 41 covering the organic layer 40, as shown in FIG. 4.

The first inorganic layer 39 and the second inorganic layer 41 are made of, for example, an inorganic material such as silicon oxide ($SiO_2$), aluminum oxide ($Al_2O_3$), or silicon carbide nitride ($Si_3N_4$). The organic layer 40 is made of, for example, an organic resin material such as acrylate, epoxy resin, silicone resin, polyurea, parylene, polyimide, or polyamide.

Figure 6:
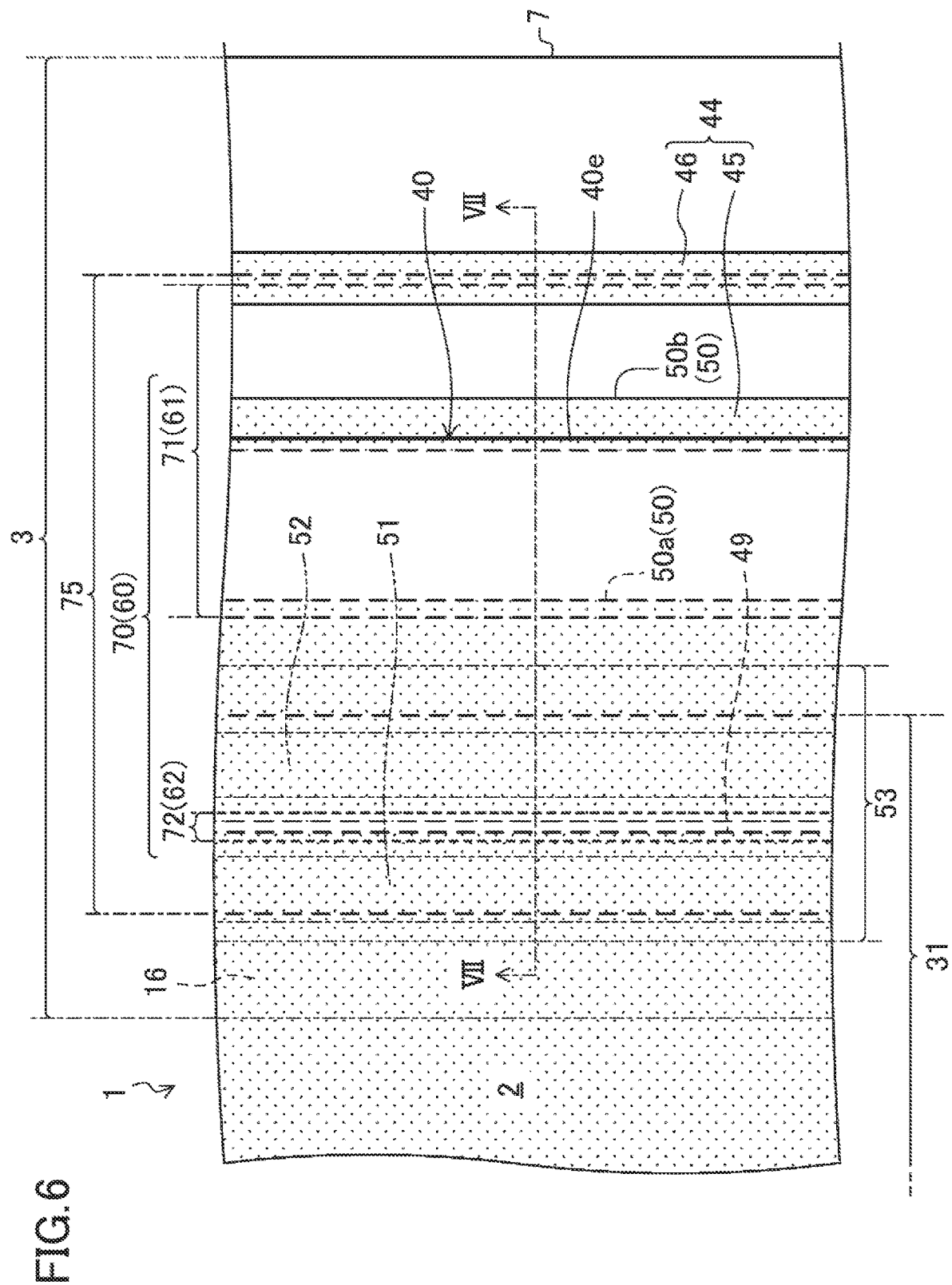
FIG. 6 is a plan view of a part, denoted by VI, of the OLED display device shown in FIG. 1.
Figure 7:
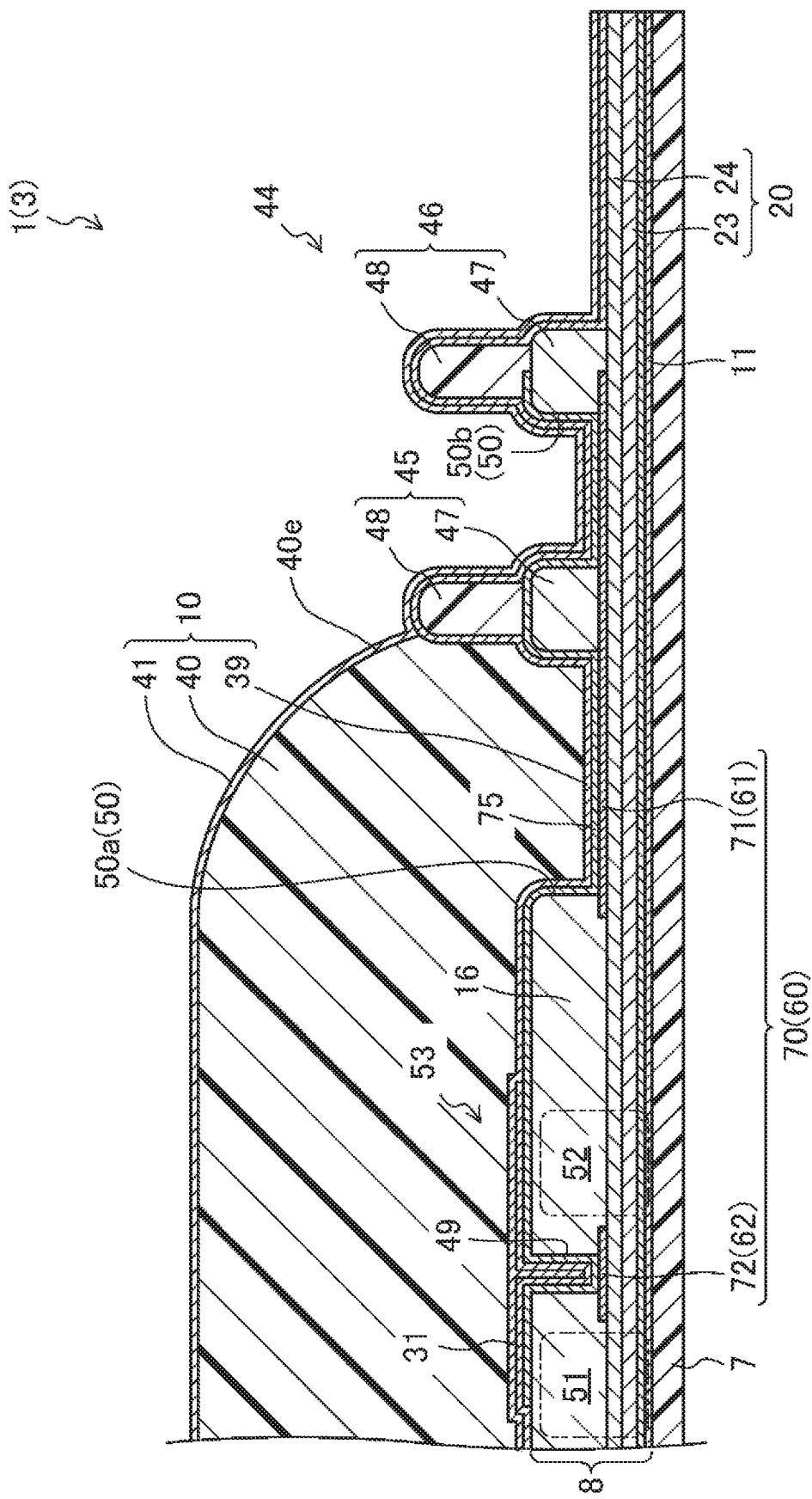
FIG. 7 is a cross-sectional view, taken along line VI VI VII-VII, of the OLED display device shown in FIG. 6.

FIG. 6 is a plan view of a part, denoted by VI, of the OLED display device 1 shown in FIG. 1. FIG. 7 is a cross-sectional view, taken along line VII-VII, of the OLED display device 1 shown in FIG. 6. In FIG. 6, the areas where the planarization film 16, a first damming wall 45, and a second damming wall 46 are formed are dotted. The first inorganic layer 39 and the second inorganic layer 41, which constitute the sealing film 10, are not shown. The organic layer 40 has a peripheral edge 40e thereof indicated by a thick line. This convention also holds true in FIGS. 8, 10, and 11 to which reference will be made in variation examples below.

The first inorganic layer 39, the organic layer 40, and the second inorganic layer 41 are provided across the entire display area 2 and additionally provided in the frame area 3 as shown in FIGS. 6 and 7. The first inorganic layer 39, the organic layer 40, and the second inorganic layer 41 have peripheral edges thereof in the frame area 3. The peripheral edge 40e of the organic layer 40 is located closer to the display area 2 in the frame area 3 than are the peripheral edges of the first inorganic layer 39 and the second inorganic layer 41.

The frame area 3 is provided with a damming structure 44 for damming up an organic resin material for the organic layer 40 to stop the spread of the organic resin material when the organic resin material is applied in the manufacture of the OLED display device 1. The damming structure 44 includes the first damming wall 45 around the display area 2 and the second damming wall 46 around the first damming wall 45. The first damming wall 45 and the second damming wall 46 are provided along the entire periphery of the planarization film 16.

The first damming wall 45 and the second damming wall 46 are shaped like geometrically similar rectangular frames and separated by a distance from each other in the width direction of the frame area 3. Each of the first damming wall 45 and the second damming wall 46 includes a stack of a first wall layer 47 and a second wall layer 48. The first wall layer 47 is formed of the same material and in the same layer as the planarization film 16. The second wall layer 48 is formed of the same material and in the same layer as the edge cover 33.

There are provided slits 50 in the external side of the planarization film 16, to expose the underlying layers of the planarization film 16 at the side of the planarization film 16. Specifically, a first slit 50a is formed as one of the slits 50 between the planarization film 16 and the first damming wall 45, and a second slit 50b is formed as another one of the slits 50 between the first damming wall 45 and the second damming wall 46.

There is also formed a trench 49 through the planarization film 16. The trench 49 is provided in those portions that constitute the three sides of the frame area 3 other than the side thereof on which the terminal portion 4 is provided, so as to surround the display area 2 as shown in FIG. 1. The trench 49 extends linearly along all the sides of the frame area 3 in a plan view. The trench 49 separates, so as to divide, the planarization film 16 into a segment internal to the frame area 3 and a segment external to the frame area 3, to prevent water from entering the display area 2.

The trench 49 is located in the control circuit region 53 in the frame area 3. In the control circuit region 53, the gate driver circuit 51 and the light-emission control circuit 52 are provided on the different sides of the trench 49 in the frame area 3. Specifically, the gate driver circuit 51 is provided between the trench 49 and the display area 2, and the light-emission control circuit 52 is provided between the trench 49 and the first slit 50a.

The organic layer 40 is provided from the display area 2 to at least the first damming wall 45, is in contact with the first damming wall 45, and overlaps the first slit 50a. In the example shown in FIGS. 6 and 7, the organic layer 40 is provided reaching the internal side of the first damming wall 45, but is dammed up by the first damming wall 45 to not move beyond the first damming wall 45. The organic layer 40 covers various elements and circuits such as the OLEDs 9, the gate driver circuit 51, and the light-emission control circuit 52. If there is a foreign object in the locations of the various elements and circuits, the organic layer 40 serves as a buffer layer covering and completely enwrapping the foreign object to prevent the sealing film 10 from developing defects.

The first inorganic layer 39 and the second inorganic layer 41 cover both the first damming wall 45 and the second damming wall 46. The first inorganic layer 39 and the second inorganic layer 41 have peripheral edge portions thereof joined together outside the first damming wall 45. In other words, the organic layer 40 is enwrapped by the first inorganic layer 39 and the second inorganic layer 41 and enclosed between the first inorganic layer 39 and the second inorganic layer 41.

There is provided a first conductive layer 70 underlying the planarization film 16 in the frame area 3. The first conductive layer 70 at least partially constitutes the low-voltage power supply lines 60. The first conductive layer 70 includes a relatively wide, outer conductive layer 71 that at least partially constitutes the outer line 61 and a relatively narrow, inner conductive layer 72 that at least partially constitutes the inner line 62. The outer conductive layer 71 and the inner conductive layer 72 are provided on the interlayer insulating film 20 and formed of the same film and in the same layer as the source lines 15s, the source electrodes 21, and the drain electrodes 22 in the display area 2.

The outer conductive layer 71 is provided from a location overlapping the planarization film 16 to the second damming wall 46. The outer conductive layer 71 is exposed from the planarization film 16, the first damming wall 45, and the second damming wall 46 in the first slit 50a and the second slit 50b. On the other hand, the inner conductive layer 72 is provided all the way from one side to the other of the trench 49 in the control circuit region 53, in other words, provided across the entire width of the trench 49. The inner conductive layer 72 is electrically insulated from the gate driver circuit 51 and the light-emission control circuit 52 in the control circuit region 53 and exposed from the planarization film 16 in the trench 49, specifically, on the bottom of the trench 49, thereby forming the bottom face of the trench 49.

There is provided a second conductive layer 75 overlying the planarization film 16 in the frame area 3. The second conductive layer 75 electrically connects the second electrodes 31 of the OLEDs 9 to the first conductive layer 70. The second conductive layer 75 is formed of the same material and in the same layer as the first electrodes 29 of the OLEDs 9 and provided on the planarization film 16. The second conductive layer 75 is provided from a location on the planarization film 16 to the second damming wall 46 and located between the first wall layer 47 and the second wall layer 48 of the first damming wall 45 and the second damming wall 46 respectively. The second conductive layer 75 is placed on, and in contact with, the outer conductive layer 71 in the first slit 50a and the second slit 50b and electrically connected to the outer conductive layer 71 in the external side of the planarization film 16.

The second conductive layer 75 is provided on the planarization film 16 from the external side of the planarization film 16 as viewed from the trench 49 to the display area 2 side as viewed from the trench 49 to cover the inner surface of the trench 49 and is connected to the inner conductive layer 72 exposed in the trench 49. The second electrode 31 is provided on the planarization film 16 from the display area 2 side as viewed from the trench 49 to the external side of the planarization film 16 as viewed from the trench 49 to cover the inner surface of the trench 49 similarly to the second conductive layer 75. This structure where the inner surface of the trench 49 is covered with the second conductive layer 75 and the second electrode 31 prevents water from entering the display area 2 of the OLED display device 1 from the external environment through the trench 49.

The second electrode 31 is placed on, and in contact with, the second conductive layer 75 in the trench 49 for electrical connection to the second conductive layer 75. This structure electrically connects the second electrode 31 to the inner conductive layer 72 via the second conductive layer 75 in the trench 49. As described earlier, the second electrode 31 is electrically connected to the outer conductive layer 71 in the external side of the planarization film 16 and also to the inner conductive layer 72 via the trench 49 in the control circuit region 53, for connection to the low-voltage power supply line 60.

The OLED display device 1 structured as above is arranged, in each subpixel 6, to turn on the first TFT 12A in response to an incoming gate signal to the first TFT 12A via the gate line 15g, apply a prescribed voltage corresponding to a source signal to the gate electrode 19 and the capacitor 14 of the second TFT 12B via the source line 15s, and turn on the third TFT 12C in response to an incoming light-emission control signal to the third TFT 12C via the light-emission control line 15e, to specify the magnitude of the current from the high-voltage power supply line 15p on the basis of the gate voltage of the second TFT 12B, so that the current is fed to the OLED 9, thereby causing the light-emitting layer 36 in the organic light-emitting layer 30 to emit light to display an image. In the OLED display device 1, the gate voltage of the second TFT 12B is retained by the capacitor 14 when the first TFT 12A is turned off. The organic light-emitting layer 30 (light-emitting layer 36) in the subpixel 6 therefore continuously emits light until a gate signal is inputted in a next frame.

This OLED display device 1 can be manufactured, for example, by forming the TFT layer 8, the OLEDs 9, and the sealing film 10 by a well-known method on the resin substrate layer 7 provided on a glass substrate and thereafter detaching the glass substrate from the resin substrate layer 7.

In the step of forming the source electrodes 21 and the drain electrodes 22 in the process of forming the TFT layer 8, after forming a metal film (e.g., a stack of Ti/Al/Ti films) on the substrate having formed thereon the interlayer insulating film 20, for example, by sputtering, the metal film is subjected to photolithography, etching, and photoresist removal for the patterning of the metal film, to form the first conductive layer 70 (outer conductive layer 71 and inner conductive layer 72) as well as the source electrodes 21 and the drain electrodes 22.

In the step of forming the planarization film 16, after forming a photosensitive organic resin film of, for example, an acrylic resin, for example, by a publicly known application method such as spin coating on the substrate having formed thereon the source electrodes 21 and the drain electrodes 22, the organic resin film is subjected to photolithography for the patterning of the organic resin film, to form the planarization film 16 with the trench 49 formed in the control circuit region 53.

In the step of forming the first electrodes 29 in the process of forming the OLEDs 9, after forming a metal film (e.g., an ITO layer, a MgAg layer, and another ITO layer) on the substrate having formed thereon the TFT layer 8, for example, by sputtering, the metal film is subjected to photolithography, etching, and photoresist removal for the patterning of the metal film, to form the second conductive layer 75 as well as the first electrodes 29.

To this end, the second conductive layer 75 is provided so as to be placed on, and in contact with, the outer conductive layer 71 in the first slit 50a and the second slit 50b in the external side of the planarization film 16, cover the inner surface of the trench 49, and establish a connection to the inner conductive layer 72 in the trench 49. Then, in the step of forming the second electrodes 31, the second electrodes 31 are formed so as to overlap the second conductive layer 75 on the planarization film 16. In this manner, the second electrodes 31 are electrically connected to the outer conductive layer 71 in the external side of the planarization film 16 and also to the inner conductive layer 72 via the trench 49 in the control circuit region 53.

In the OLED display device 1 in accordance with this embodiment, the trench 49 is formed in the planarization film 16 in the frame area 3, and the second electrodes 31 of the OLEDs 9 are electrically connected to the outer conductive layer 71 in the external side of the planarization film 16 and electrically connected via the second conductive layer 75 to the inner conductive layer 72 exposed from the planarization film 16 in the trench 49. It therefore becomes possible to ensure contact area between the second electrodes 31 and the second conductive layer 75 and between the first conductive layer 70 and the second conductive layer 75, which reduces electrical resistance between the second electrodes 31 and the first conductive layer 70. This in turn ensures the display quality of the OLED display device 1.

First Variation Example of Embodiment

Figure 8:
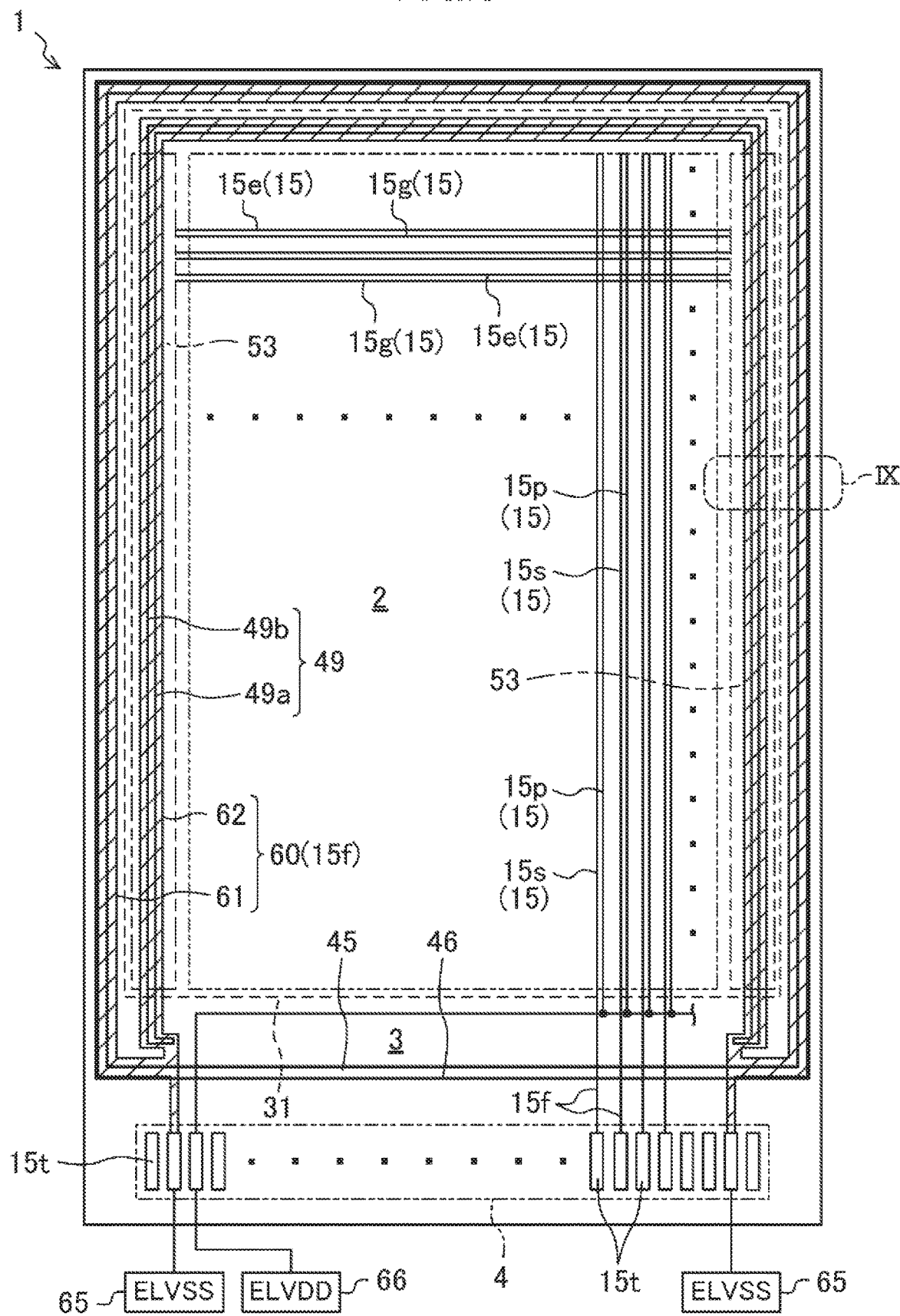
FIG. 8 is a schematic plan view of a structure of an OLED display device in accordance with a first variation example of the embodiment.
Figure 9:
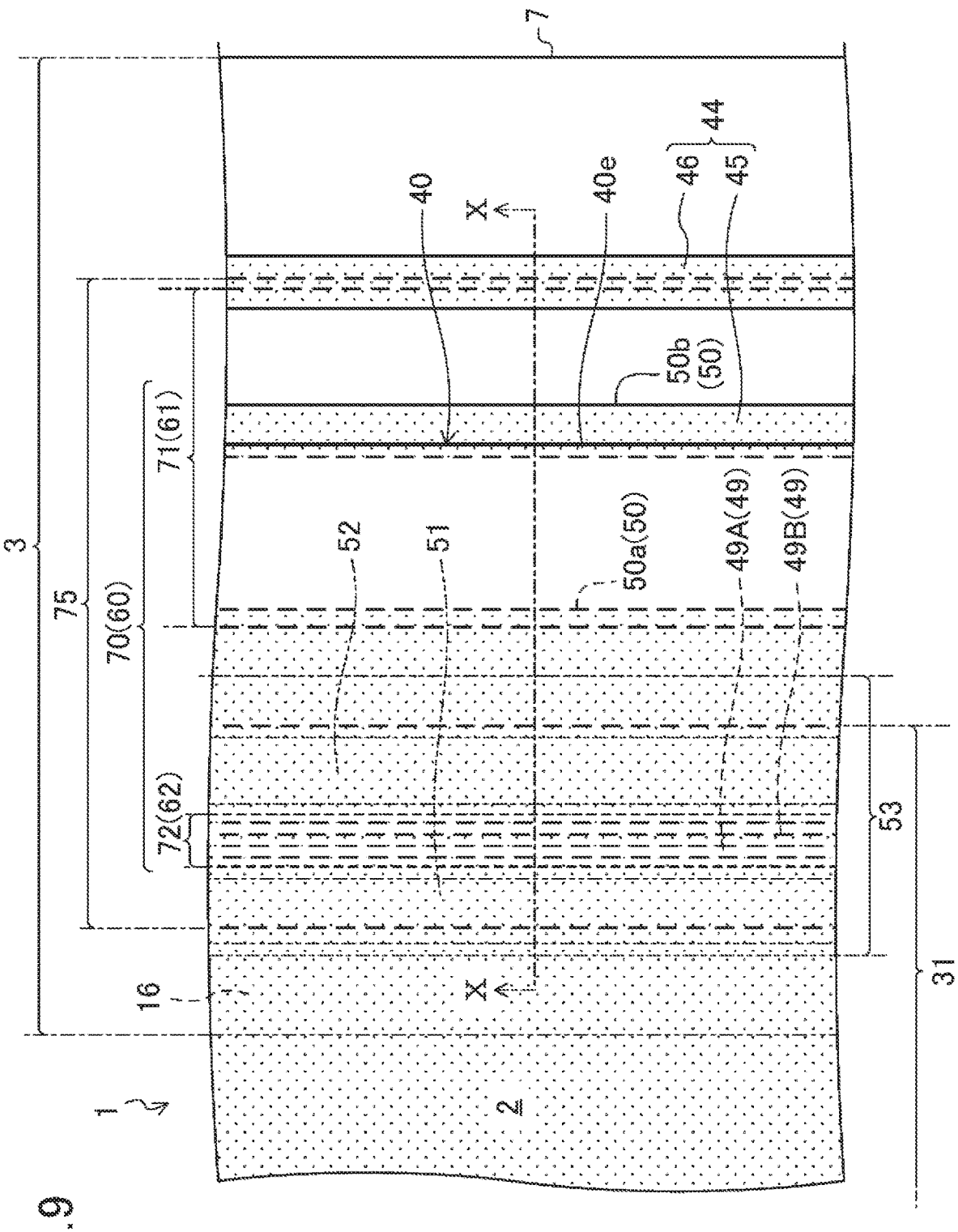
FIG. 9 is a plan view of a part, denoted by IX, of the OLED display device shown in FIG. 8.
Figure 10:
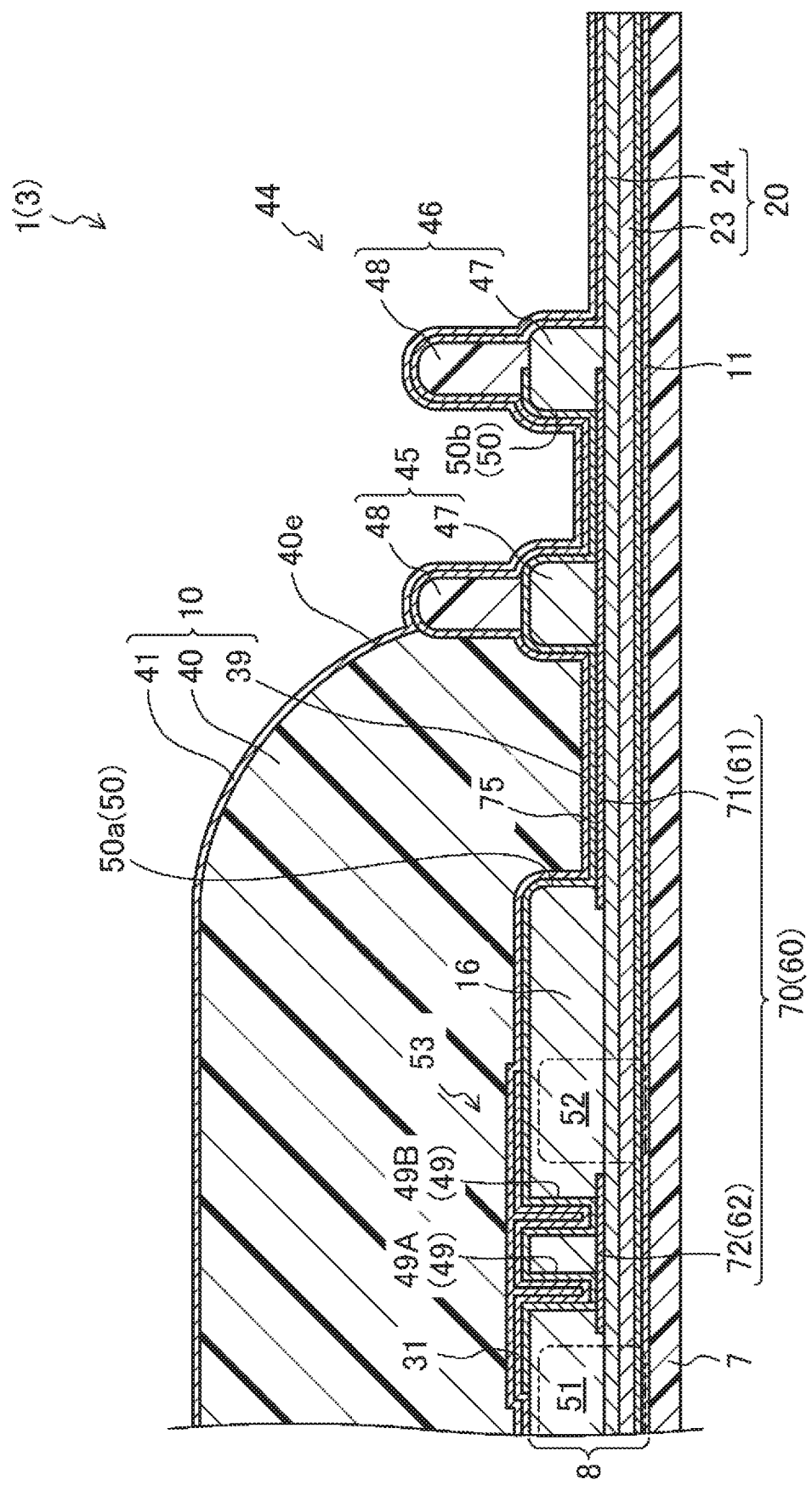
FIG. 10 is a cross-sectional view, taken along line X-X, of the OLED display device shown in FIG. 9.

FIG. 8 is a schematic plan view of a structure of the OLED display device 1 in accordance with a first variation example. FIG. 9 is a plan view of a part, denoted by IX, of the OLED display device shown in FIG. 8. FIG. 10 is a cross-sectional view, taken along line X-X, of the OLED display device 1 shown in FIG. 9. The inner conductive layer 72 is shown relatively wider in FIG. 8 than in FIG. 1 for emphasis and convenience.

The OLED display device 1 in accordance with the foregoing embodiment is described as having a single trench 49 in the planarization film 16. In contrast, the OLED display device 1 in accordance with this first variation example has two trenches 49A and 49B extending next to each other in the planarization film 16 as shown in FIGS. 8 to 10. In other words, the trenches 49A and 49B are provided so as to surround the display area 2 in a twofold manner. These two trenches 49A and 49B are connected to each other on the side of the frame area 3 where the terminal portion 4 is provided.

The inner conductive layer 72 in the first conductive layer 70 is provided from a location that is closer to the display area 2 than is one of the trenches (49A) provided relatively close to the display area 2e all the way to a location that is closer to the periphery of the frame area 3 than is the other trench (49B) provided relatively close to the periphery of the frame area 3. The inner conductive layer 72 and the two adjacent trenches 49A and 49B have a positional relationship corresponding to both the trenches 49A and 49B. In other words, the inner conductive layer 72 is provided commonly to the two adjacent trenches 49A and 49B.

The second conductive layer 75 covers the inner surfaces of both the trenches 49A and 49B and is connected to the inner conductive layers 72 exposed in the trenches 49A and 49B. The second electrodes 31 are placed on, and in contact with, the second conductive layer 75 on the planarization film 16 and in the trenches 49A and 49B. The second electrodes 31 are electrically connected to the inner conductive layer 72 via the second conductive layer 75 in the first slit 50a on the periphery of the planarization film 16 and in the two trenches 49 adjacent to the internal side of the second slit 50b.

In the OLED display device 1 in accordance with the first variation example, the two trenches 49A and 49B are provided in the planarization film 16 in the frame area 3, and the second electrodes 31 of the OLEDs 9 are electrically connected via the second conductive layer 75 to the inner conductive layer 72 exposed from the planarization film 16 in both the trenches 49A and 49B. It therefore becomes possible to increase contact area between the second electrodes 31 and the second conductive layer 75 and between the first conductive layer 70 and the second conductive layer 75. That reduces electrical resistance between the second electrodes 31 and the first conductive layer 70 in a suitable manner and enhances the display quality of the OLED display device 1.

Second Variation Example of Embodiment

Figure 11:
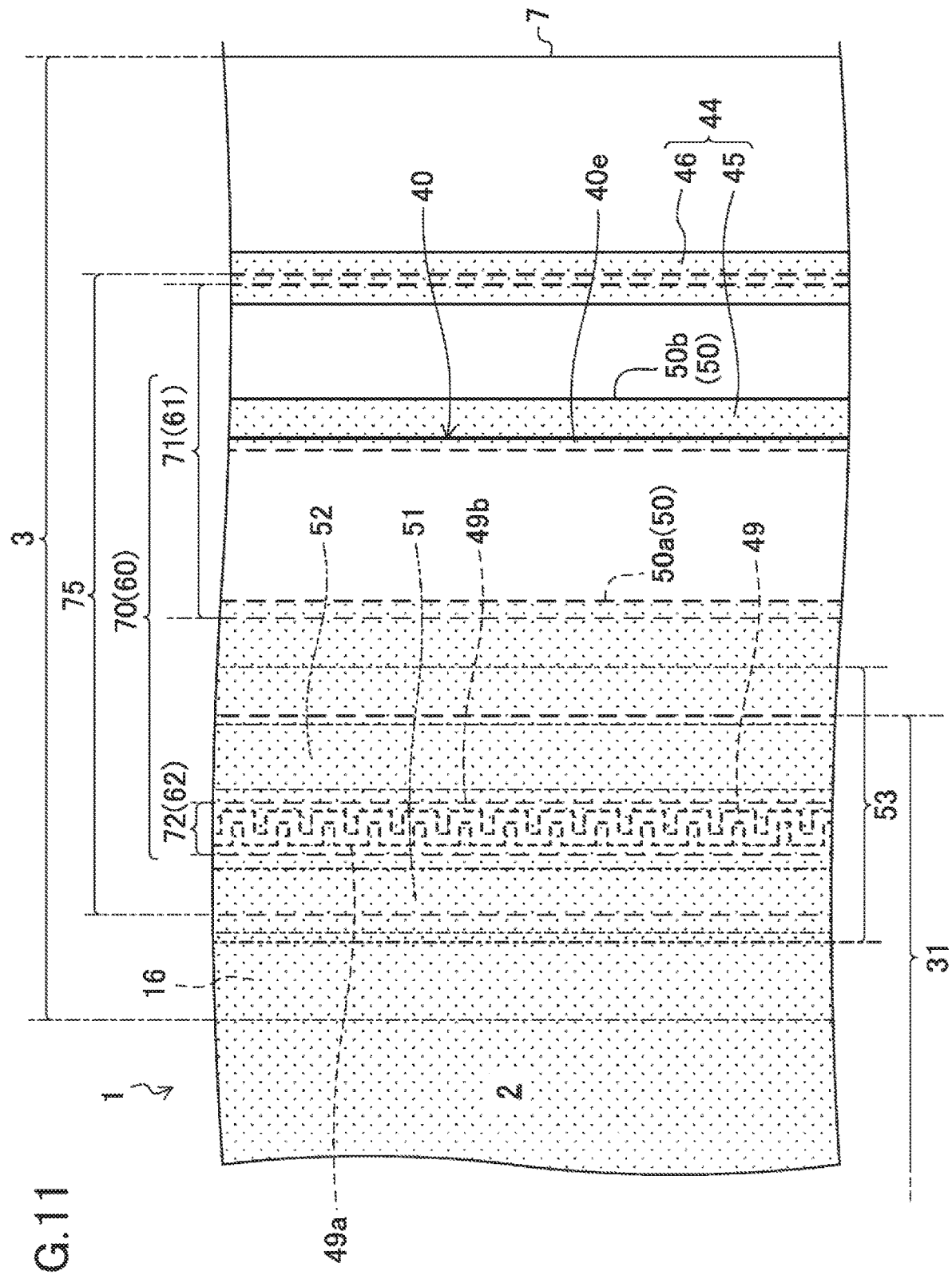
FIG. 11 is a diagram, equivalent to FIG. 6, of an OLED display device in accordance with a second variation example of the embodiment.

FIG. 11 is a diagram, equivalent to FIG. 6, of the OLED display device 1 in accordance with a second variation example. In the OLED display device 1 in accordance with the foregoing embodiment, the trench 49 is described as extending linearly along all the sides of the frame area 3 in a plan view. In contrast, in the OLED display device 1 in accordance with this second variation example, the trench 49 is formed like a line bending alternately into the internal segment of the planarization film 16 and into the external segment of the planarization film 16 like a crankshaft along all the sides of the frame area 3 in a plan view as shown in FIG. 11.

The inner conductive layer 72 in the first conductive layer 70 is provided from a location that is closer to the display area 2 than is a convexity portion 49a of the trench 49, the convexity portion 49a projecting toward the display area 2 in a plan view, all the way to a location that is closer to the periphery of the frame area 3 than is a convexity portion 49b of the frame area 3, the convexity portion 49b projecting toward the periphery. The inner conductive layer 72 and the crankshaft-like trench 49 have a positional relationship corresponding to the width direction of the trench 49. The inner conductive layer 72 hence provides the entire bottom surface of the crankshaft-like trench 49 and is exposed in the trench 49.

The second conductive layer 75 covers the entire inner surface of the crankshaft-like trench 49 and is connected to the inner conductive layer 72 exposed in the trench 49. The second electrodes 31 are placed on, and in contact with, the second conductive layer 75 on the planarization film 16 and in the crankshaft-like trench 49. The second electrodes 31 are electrically connected to the inner conductive layer 72 via the second conductive layer 75 in the first slit 50a on the periphery of the planarization film 16, in the second slit 50b, and in the crankshaft-like trench 49.

In the OLED display device 1 in accordance with the second variation example, the trench 49 is formed like a line bending like a crankshaft. This structure increases the area of the inner conductive layer 72 exposed from the planarization film 16 in the trench 49. This increased are adds to the contact area between the second conductive layer 75 and the inner conductive layer 72. The structure also increases the inner surface of the trench 49, thereby increasing contact area between the second conductive layer 75 and the second electrodes 31 in the trench 49. That reduces electrical resistance between the second electrodes 31 and the first conductive layer 70 in a suitable manner and enhances the display quality of the OLED display device 1.

Third Variation Example of Embodiment

Figure 12:
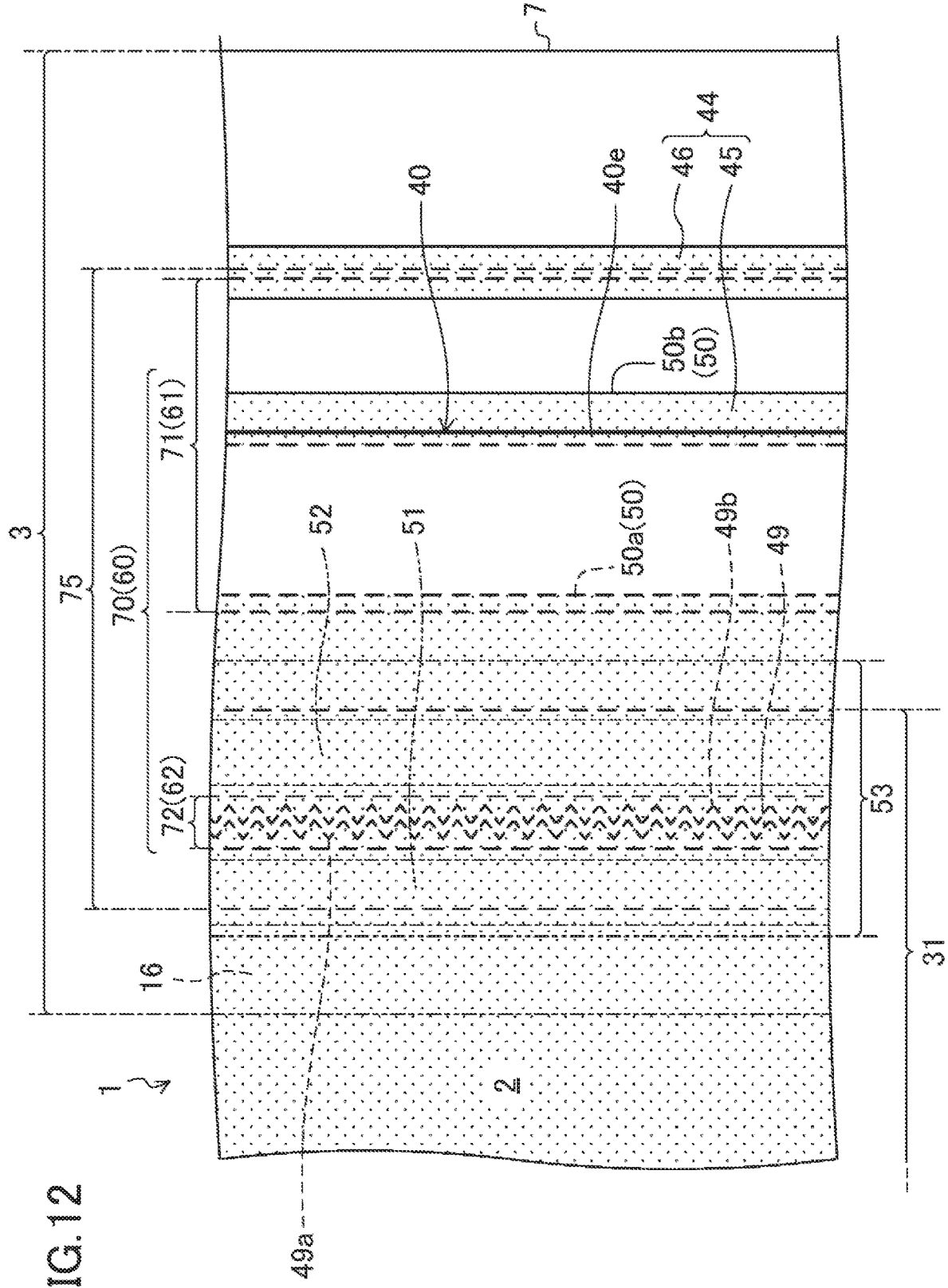
FIG. 12 is a diagram, equivalent to FIG. 6, of an OLED display device in accordance with a third variation example of the embodiment.

FIG. 12 is a diagram, equivalent to FIG. 6, of the OLED display device 1 in accordance with a third variation example. In the OLED display device 1 in accordance with the second variation example, the trench 49 is described as being formed like a line bending like a crankshaft in a plan view. In the OLED display device 1 in accordance with this third variation example, the trench 49 is formed like a line bending alternately into the internal segment of the planarization film 16 and into the external segment of the planarization film 16 like a zigzag line along all the sides of the frame area 3 in a plan view as shown in FIG. 12.

The inner conductive layer 72 in the first conductive layer 70 is provided from a location that is closer to the display area 2 side than is a corner portion 49c of the trench 49, the corner portion 49c projecting toward the display area 2 in a plan view, all the way to a location that is closer to the periphery of the frame area 3 than is a corner portion 49d of the frame area 3, the corner portion 49d projecting toward the periphery. The inner conductive layer 72 and the zigzag trench 49 have a positional relationship corresponding to the width direction of the zigzag trench 49. The inner conductive layer 72 hence provides the entire bottom surface of the zigzag trench 49 and is exposed in the trench 49.

The second conductive layer 75 covers the inner surface of the zigzag trench 49 and is connected to the inner conductive layer 72 exposed in the trench 49. The second electrodes 31 are placed on, and in contact with, the second conductive layer 75 on the planarization film 16 and in the zigzag trench 49. The second electrodes 31 are electrically connected to the inner conductive layer 72 via the second conductive layer 75 in the first slit 50a on the periphery of the planarization film 16, in the second slit 50b, and in the zigzag trench 49.

The OLED display device 1 in accordance with the third variation example achieves similar advantages to those achieved by the OLED display device 1 in accordance with the second variation example.

Fourth Variation Example of Embodiment

Figure 13:
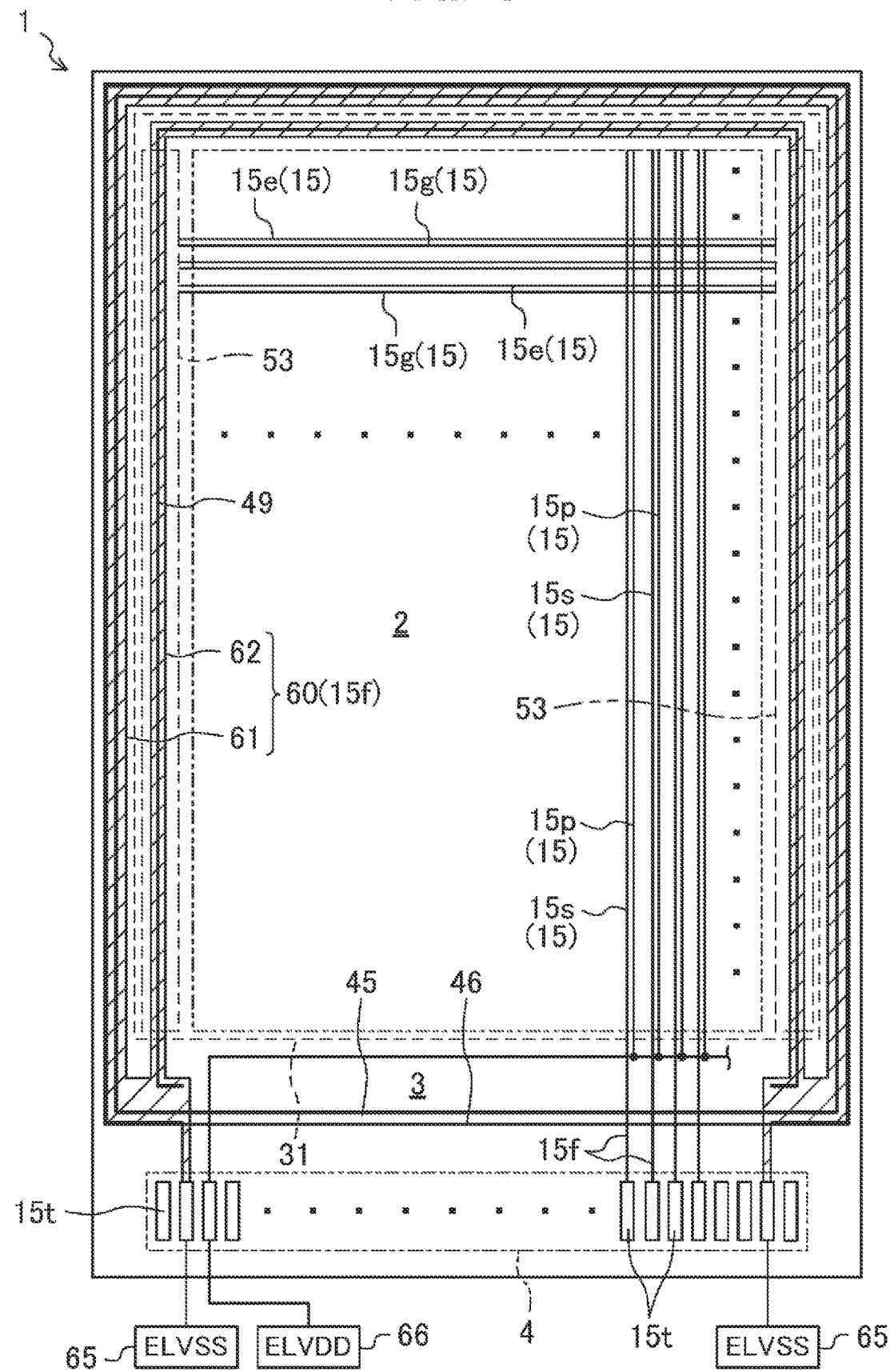
FIG. 13 is a diagram, equivalent to FIG. 1, of an OLED display device in accordance with a fourth variation example of the embodiment.
Figure 14:
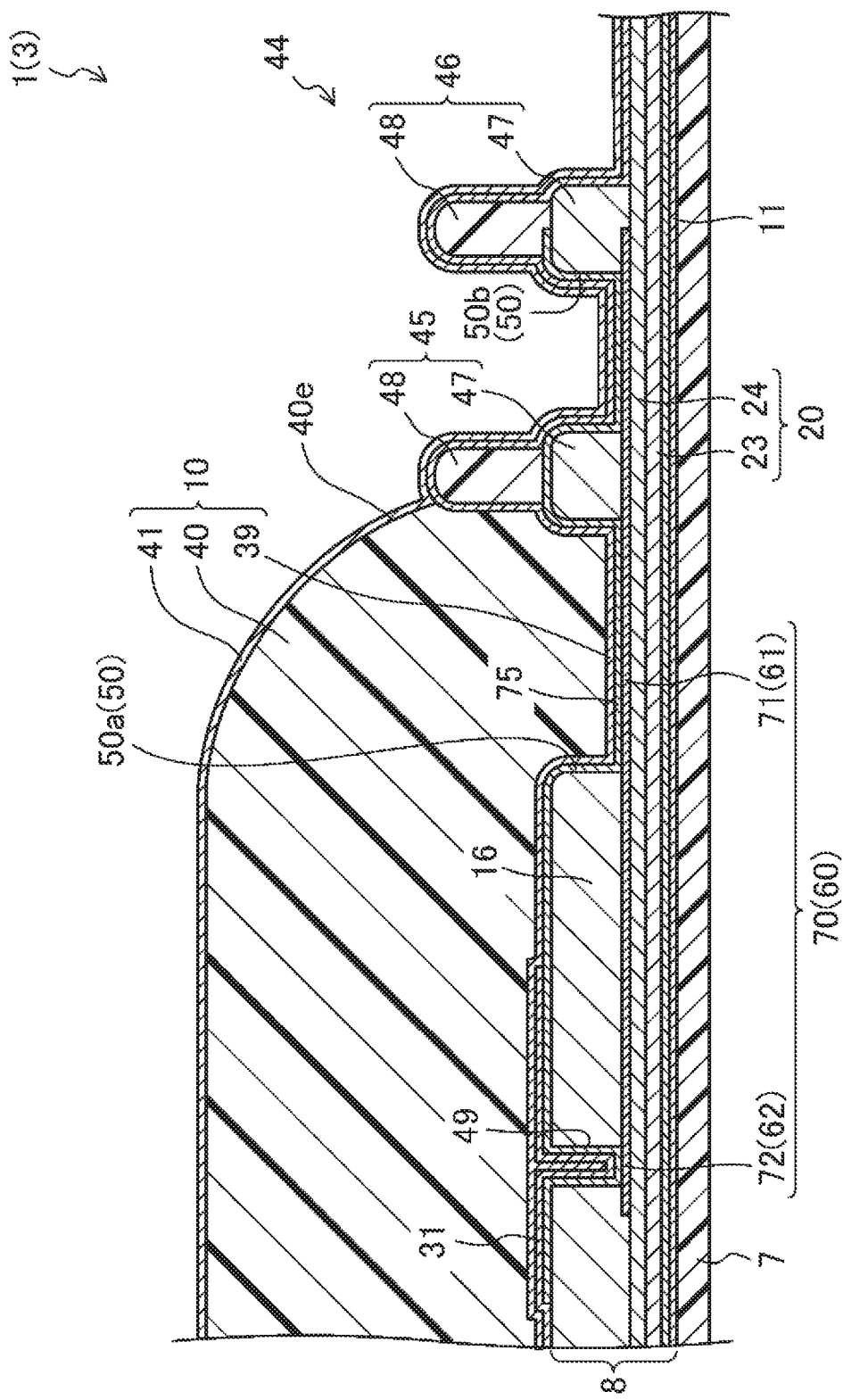
FIG. 14 is a cross-sectional view, taken along line XIV-XIV, of the OLED display device shown in FIG. 13.

FIG. 13 is a diagram, equivalent to FIG. 1, of the OLED display device 1 in accordance with a fourth variation example. FIG. 14 is a cross-sectional view, taken along line XIV-XIV, of the OLED display device 1 shown in FIG. 13. In the OLED display device 1 in accordance with the foregoing embodiment, the outer conductive layer 71 and the inner conductive layer 72 have, as an example, approximately the same respective widths on a side of the frame area 3 where the control circuit region 53 is provided and on a side thereof where the terminal portion 4 is provided. In the OLED display device 1 in accordance with this fourth variation example, the outer conductive layer 71 and the inner conductive layer 72 are separated on the sides on which the control circuit region 53 is provided, but formed contiguously on the side on which the terminal portion 4 is provided, as shown in FIGS. 13 and 14.

The gate driver circuit 51 and the light-emission control circuit 52, to name a few examples, are present on the sides of the frame area 3 where the control circuit region 53 is provided. It is therefore difficult to increase the width of the first conductive layer 70 with the outer conductive layer 71 and the inner conductive layer 72 being provided contiguously. However, none of these circuits are present on the side on which the terminal portion 4 is provided. It is therefore possible to increase the width of the first conductive layer 70 with the outer conductive layer 71 and the inner conductive layer 72 being provided contiguously. The OLED display device 1 in accordance with the fourth variation example allows for reduction in electrical resistance of the first conductive layer 70, thereby exhibiting improved display quality.

Preferred embodiments and their variation examples have been described so far to illustrate the technology disclosed here. The technology disclosed here is however not limited to these embodiments and variation examples and applicable also to other embodiments that may involve, for example, suitable modification, replacement, addition, and/or omission. The elements described in the embodiments and variation examples above may be combined to create new embodiments. The elements described in the description and attached drawings may include those that are not essential in solving problems. Therefore, that these non-essential elements are described in the description and attached drawings does not necessarily justify the assertion that the non-essential elements are essential.

In the foregoing embodiment, the outer conductive layer 71 and the second conductive layer 75 in the first conductive layer 70 are described as overlapping in the first slit 50a. The technology disclosed here is however by no means limited to this example. Alternatively, for example, the outer conductive layer 71 may be provided only external to the first damming wall 45 in the frame area 3, and the second conductive layer 75 may be provided from a location overlying the planarization film 16 to the second damming wall 46 in such a manner that the second conductive layer 75 is placed on, and in contact with, the outer conductive layer 71 only external to the first damming wall 45.

In the foregoing embodiment, the organic layer 40 is described as being provided from the display area 2 to the first damming wall 45. The technology disclosed here is however by no means limited to this example. Alternatively, for example, the organic layer 40 may be provided from the display area 2 to the second damming wall 46 or to the external side of the second damming wall 46.

In the foregoing embodiment, each subpixel 6 is described as having formed therein a different organic light-emitting layer 30. The technology disclosed here however is not applicable only to this example. Alternatively, a plurality of subpixels 6 may have formed therein a common organic light-emitting layer 30, in which case the OLED display device 1 may include, for example, a color filter to reproduce shades of color by the subpixels 6.

The present embodiment describes, as an example, the OLED display device 1 including the resin substrate layer 7 as a substrate. The technology disclosed here is applicable not only to this example, but also to substrates made of inorganic materials such as glass and quartz, plastics such as polyethylene terephthalate, and ceramics such as alumina. Additionally, the substrate may be, for example, an aluminum, iron, or like metal substrate having one of the two faces thereof coated, for example, with silica gel or an organic insulating material or a metal substrate having a surface thereof subjected to an insulation treatment, for example, by anode oxidation.

The foregoing embodiment describes the first TFTs 12A, the second TFTs 12B, and the third TFTs 12C as having a top-gate structure. The technology disclosed here is not applicable only to this example. Alternatively, the first TFTs 12A, the second TFTs 12B, and the third TFTs 12C may have a bottom-gate structure.

The foregoing embodiment describes, as an example, the OLED display device 1 including the first electrodes 29 as anodes and the second electrodes 31 as cathodes. The technology disclosed here is applicable not only to this example, but also to the OLED display device 1 including, for example, the organic light-emitting layer 30 having a reversed layer structure, the first electrodes 29 serving as cathodes, and the second electrodes 31 serving as anodes.

The foregoing embodiment describes the OLED display device 1 as an example of a display device. Alternatively, the technology disclosed here is applicable to any display device including a plurality of current-driven light-emitting elements, for example, to a display device including QLEDs (quantum-dot light-emitting diodes) which are light-emitting elements including a quantum dot layer.

INDUSTRIAL APPLICABILITY

As described so far, the technology disclosed here is useful in display devices in which the light-emitting elements have electrodes electrically connected to a conductive layer in frame lines in a frame area.

The invention claimed is:
1. A display device comprising:
a substrate;
a first conductive layer on the substrate;
a planarization film on the first conductive layer;
a plurality of light-emitting elements on the planarization film; and
a damming wall along an entirety of a periphery of the planarization film in the frame area so as to surround the display area, wherein
the display device has: a display area where an image is displayed using light emitted by the plurality of light-emitting elements; and a frame area surrounding the display area,
the plurality of light-emitting elements includes: a first electrode; a functional layer on the first electrode; and a second electrode overlapping the first electrode with the functional layer intervening therebetween,
the frame area includes a second conductive layer in contact with the second electrode on the planarization film and also in contact with the first conductive layer on the periphery of the planarization film, the second electrode being electrically connected to the first conductive layer via the second conductive layer,
the planarization film includes, in the frame area, a portion where at least one trench extends along three sides of the display area in a plan view through the planarization film in such a manner that the at least one trench divides the planarization film into a segment internal to the frame area and a segment external to the frame area,
the first conductive layer is provided additionally in a location corresponding to the at least one trench, the additional first conductive layer being exposed from the planarization film in the at least one trench, and
the second electrode is in contact with the second conductive layer in the at least one trench and electrically connected to the first conductive layer via the second conductive layer,
the first conductive layer and the second conductive layer are in contact with each other in a slit being outside the planarization film and formed between the planarization film and the damming wall, and
the second electrode and the second conductive layer are in contact with each other on the planarization film.

2. The display device according to claim 1, wherein
the frame area includes a control circuit region where there is provided a control circuit monolithically on the substrate, and
the control circuit is provided on two sides of the at least one trench in the frame area.

3. The display device according to claim 2, further comprising a terminal portion on a side of the frame area other than a side thereof on which the control circuit region is provided, wherein
the first conductive layer on the periphery of the planarization film and the additional first conductive layer exposed from the planarization film in the at least one trench are separated on the side on which the control circuit region is provided and provided contiguously on the side on which the terminal portion is provided.

4. The display device according to claim 1, wherein the first conductive layer is electrically connected to a low-voltage power supply.

5. The display device according to claim 1, wherein the at least one trench comprises a plurality of trenches extending adjacent to each other.

6. The display device according to claim 5, wherein
the first conductive layer is provided commonly to the adjacent trenches, and
the second electrode is electrically connected to both the first conductive layer and the additional first conductive layer via the second conductive layer in the adjacent trenches.

7. The display device according to claim 1, wherein the at least one trench extends linearly along a side of the frame area in the plan view.

8. The display device according to claim 1, wherein the at least one trench extends like a line bending alternately into the internal segment of the planarization film and into the external segment of the planarization film along a side of the frame area in the plan view.

9. The display device according to claim 1, further comprising a source line in the display area, the source line being configured to transmit a source signal, wherein
    the first conductive layer is formed of a same material and in a same layer as the source line, and
    the second conductive layer is formed of a same material and in a same layer as the first electrode.

10. The display device according to claim 1, further comprising an edge cover in the display area between the first electrode and the second electrode, wherein
    the damming wall includes: a first wall layer formed of a same material and in a same layer as the planarization film; and a second wall layer on the first wall layer, the second wall layer being formed of a same material and in a same layer as the edge cover.

11. The display device according to claim 1, further comprising a sealing film covering the plurality of light-emitting elements, wherein
    the sealing film includes: a first inorganic layer on the plurality of light-emitting elements; an organic layer on the first inorganic layer; and a second inorganic layer on the organic layer, and
    the organic layer is dammed up by the damming wall.

\* \* \* \* \*